United States Patent
Kurita et al.

(10) Patent No.: US 9,324,597 B2
(45) Date of Patent: Apr. 26, 2016

(54) VERTICAL INLINE CVD SYSTEM

(75) Inventors: Shinichi Kurita, San Jose, CA (US);
Jozef Kudela, San Jose, CA (US);
Suhail Anwar, San Jose, CA (US); John M. White, Hayward, CA (US);
Dong-Kil Yim, Sungnam (KR); Hans Georg Wolf, Erlensee (DE); Dennis Zvalo, Santa Clara, CA (US); Makoto Inagawa, Palo Alto, CA (US); Ikuo Mori, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 224 days.

(21) Appl. No.: 13/098,255

(22) Filed: Apr. 29, 2011

(65) Prior Publication Data

US 2012/0031335 A1    Feb. 9, 2012

Related U.S. Application Data

(60) Provisional application No. 61/416,532, filed on Nov. 23, 2010, provisional application No. 61/354,230, filed on Jun. 13, 2010, provisional application No. 61/330,296, filed on Apr. 30, 2010.

(51) Int. Cl.
*H01J 37/32* (2006.01)
*H01L 21/67* (2006.01)
(Continued)

(52) U.S. Cl.
CPC ...... *H01L 21/67712* (2013.01); *C23C 16/4587* (2013.01); *C23C 16/46* (2013.01);
(Continued)

(58) Field of Classification Search
CPC .. C23C 16/4587; C23C 16/46; C23C 16/463; C23C 16/511; C23C 16/54; C23C 14/34; C23C 14/345; C23C 14/3485; C23C 16/515; H01L 21/67126; H01L 21/67173; H01L 21/6719; H01L 21/67201; H01L 21/67712; H01L 31/202; H01J 37/32091; H01J 37/321; H01J 37/32192–37/32256; H01J 37/3222; H01J 37/32284; H01J 37/3408; H05H 1/46; Y02E 10/50

See application file for complete search history.

(56) References Cited

U.S. PATENT DOCUMENTS 4,274,936 A * 6/1981 Love ..................... 204/192.13
4,410,558 A * 10/1983 Izu et al. ..................... 438/62
(Continued)

FOREIGN PATENT DOCUMENTS

DE    19503205 C1 *  7/1996
JP    7-106094 A       4/1995
(Continued)

OTHER PUBLICATIONS

"Bulletin Nov. 2006—Series 31 ISO-KF Components." MKS Instruments. 2006. pp. 1-33.*

(Continued)

*Primary Examiner* — Parviz Hassanzadeh
*Assistant Examiner* — Stanislav Antolin
(74) *Attorney, Agent, or Firm* — Patterson & Sheridan, LLP

(57) ABSTRACT

The present invention generally relates to a vertical CVD system having a processing chamber that is capable of processing multiple substrates. The multiple substrates are disposed on opposite sides of the processing source within the processing chamber, yet the processing environments are not isolated from each other. The processing source is a horizontally centered vertical plasma generator that permits multiple substrates to be processed simultaneously on either side of the plasma generator, yet independent of each other. The system is arranged as a twin system whereby two identical processing lines, each with their own processing chamber, are arranged adjacent to each other. Multiple robots are used to load and unload the substrates from the processing system. Each robot can access both processing lines within the system.

20 Claims, 14 Drawing Sheets

(51) Int. Cl.
*C23C 16/458* (2006.01)
*C23C 16/46* (2006.01)
*C23C 16/511* (2006.01)
*C23C 16/54* (2006.01)
*H01L 21/677* (2006.01)

(52) U.S. Cl.
CPC ............ *C23C 16/463* (2013.01); *C23C 16/511* (2013.01); *C23C 16/54* (2013.01); *H01J 37/3222* (2013.01); *H01J 37/32192* (2013.01); *H01L 21/6719* (2013.01); *H01L 21/67126* (2013.01); *H01L 21/67173* (2013.01); *H01L 21/67201* (2013.01)

(56) References Cited

U.S. PATENT DOCUMENTS

| | | | | |
|---|---|---|---|---|
| 4,423,701 | A * | 1/1984 | Nath et al. | 118/715 |
| 4,474,659 | A * | 10/1984 | Fazlin | 204/192.12 |
| 4,566,403 | A * | 1/1986 | Fournier | 118/718 |
| 4,576,830 | A * | 3/1986 | Kiss | 427/569 |
| 4,893,584 | A * | 1/1990 | Doehler et al. | 118/723 MW |
| 5,252,178 | A * | 10/1993 | Moslehi | 134/1.1 |
| 5,389,154 | A * | 2/1995 | Hiroshi et al. | 118/723 MR |
| 5,397,737 | A * | 3/1995 | Mahan et al. | 438/482 |
| 5,538,610 | A * | 7/1996 | Gesche et al. | 204/298.15 |
| 5,595,606 | A * | 1/1997 | Fujikawa et al. | 118/725 |
| 5,614,055 | A * | 3/1997 | Fairbairn et al. | 156/345.33 |
| 5,726,412 | A * | 3/1998 | Briffod et al. | 219/121.43 |
| 5,776,819 | A * | 7/1998 | Mahan et al. | 438/482 |
| 5,843,236 | A * | 12/1998 | Yoshiki et al. | 118/723 MR |
| 5,900,065 | A * | 5/1999 | Liehr et al. | 118/723 HC |
| 6,124,186 | A * | 9/2000 | Molenbroek et al. | 438/482 |
| 6,186,090 | B1 * | 2/2001 | Dotter et al. | 118/718 |
| 6,191,532 | B1 * | 2/2001 | Liehr | 315/111.21 |
| 6,194,835 | B1 * | 2/2001 | Liehr | 315/111.21 |
| 6,214,706 | B1 * | 4/2001 | Madan et al. | 438/482 |
| 6,251,183 | B1 * | 6/2001 | Iwancizko et al. | 117/88 |
| 6,487,986 | B1 * | 12/2002 | Liehr et al. | 118/723 MW |
| 6,638,839 | B2 * | 10/2003 | Deng et al. | 438/485 |
| 6,755,151 | B2 * | 6/2004 | Deng et al. | 118/723 HC |
| 7,267,319 | B2 * | 9/2007 | Vitrone | 248/649 |
| 7,375,041 | B2 * | 5/2008 | Jang | 438/800 |
| 2002/0078892 | A1 * | 6/2002 | Takahashi | 118/719 |
| 2004/0011465 | A1 * | 1/2004 | Matsumoto et al. | 156/345.41 |
| 2004/0020432 | A1 * | 2/2004 | Takagi et al. | 118/723 I |
| 2005/0183665 | A1 * | 8/2005 | Lee et al. | 118/715 |
| 2005/0183824 | A1 * | 8/2005 | Lee et al. | 156/345.31 |
| 2005/0186346 | A1 * | 8/2005 | Richert et al. | 427/294 |
| 2005/0211169 | A1 | 9/2005 | Choi et al. | |
| 2006/0008342 | A1 | 1/2006 | Putzi | |
| 2006/0011231 | A1 * | 1/2006 | Ueda et al. | 136/244 |
| 2006/0177288 | A1 | 8/2006 | Parker et al. | |
| 2007/0048456 | A1 * | 3/2007 | Keshner et al. | 427/569 |
| 2007/0095281 | A1 * | 5/2007 | Stowell et al. | 118/715 |
| 2007/0098893 | A1 * | 5/2007 | Stowell | 427/248.1 |
| 2007/0098916 | A1 * | 5/2007 | Stowell | 427/561 |
| 2008/0127887 | A1 * | 6/2008 | Leung et al. | 118/50.1 |
| 2008/0187766 | A1 * | 8/2008 | Heider et al. | 428/432 |
| 2008/0286495 | A1 * | 11/2008 | Stowell | 427/575 |
| 2009/0004874 | A1 | 1/2009 | Sant | |
| 2009/0023274 | A1 * | 1/2009 | Cao et al. | 438/478 |
| 2009/0238998 | A1 * | 9/2009 | Stowell et al. | 427/575 |
| 2010/0215541 | A1 * | 8/2010 | Spitzl | 422/28 |
| 2010/0251960 | A1 * | 10/2010 | Shimizu | 118/50 |
| 2010/0301012 | A1 * | 12/2010 | Spitzl | 216/69 |
| 2011/0076420 | A1 * | 3/2011 | Stowell | 427/569 |
| 2011/0076422 | A1 * | 3/2011 | Stowell | 427/575 |
| 2011/0097517 | A1 * | 4/2011 | Stowell et al. | 427/575 |
| 2011/0097518 | A1 * | 4/2011 | Olgado | 427/575 |
| 2011/0097878 | A1 * | 4/2011 | Olgado | 438/478 |
| 2012/0031333 | A1 * | 2/2012 | Kurita et al. | 118/719 |
| 2013/0068161 | A1 * | 3/2013 | White et al. | 118/723 R |

FOREIGN PATENT DOCUMENTS

| | | | | |
|---|---|---|---|---|
| JP | 2001126899 A | * | 5/2001 | |
| JP | 2001-192830 A | | 7/2001 | |
| JP | 2001192830 A | * | 7/2001 | ............ C23C 16/26 |
| JP | 2006-128000 A | | 5/2006 | |
| JP | 2006-278643 A | | 10/2006 | |
| JP | 2009-054997 A | | 3/2009 | |
| JP | 2011-515582 A | | 5/2011 | |
| KR | 10-2003-0081074 | | 10/2003 | |
| KR | 10-2004-0010228 | | 1/2004 | |
| KR | 10-2004-0049271 | | 6/2004 | |
| WO | 00/43568 A1 | | 7/2000 | |
| WO | WO 0043568 A1 | * | 7/2000 | |
| WO | 2009009607 A1 | | 1/2009 | |
| WO | WO 2009009499 A1 | * | 1/2009 | |
| WO | WO 2009078351 A1 | * | 6/2009 | |
| WO | 2009/117229 A2 | | 9/2009 | |
| WO | WO 2009117229 A2 | * | 9/2009 | |

OTHER PUBLICATIONS

International Search Report and Written Opinion for PCT/US2011/034623 dated Dec. 19, 2011.
International Search Report and Written Opinion for PCT/US2011/034619 dated Jan. 12, 2012.
Office Action and Search Report for Chinese Application No. 201180020889.4 dated Jun. 5, 2014.
Japanese Office Action (with attached English translation) for Application No. 2013-508289 dated Feb. 16, 2015; 8 total pages.

* cited by examiner

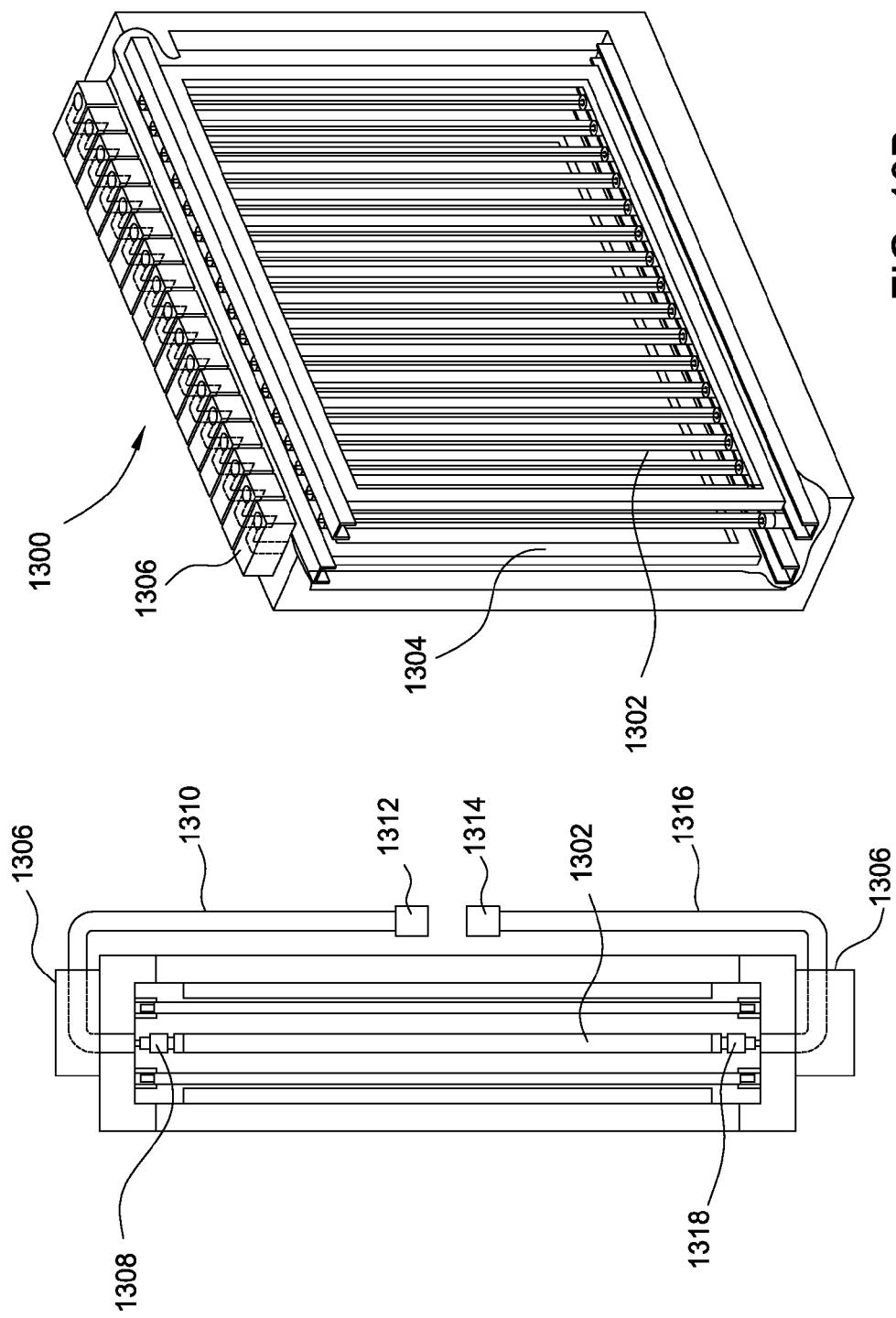

VERTICAL INLINE CVD SYSTEM

CROSS REFERENCE TO RELATED APPLICATION

This application claims priority to U.S. Provisional Patent Application Ser. No. 61/416,532, filed Nov. 23, 2010, U.S. Provisional Patent Application Ser. No. 61/354,230, filed Jun. 13, 2010, and U.S. Provisional Patent Application Ser. No. 61/330,296, filed Apr. 30, 2010 each of which are incorporated by reference in their entirety.

BACKGROUND OF THE INVENTION

1. Field of the Invention

Embodiments of the present invention generally relate to a vertical chemical vapor deposition (CVD) system.

2. Description of the Related Art

CVD is a process whereby chemical precursors are introduced into a processing chamber, chemically react to form a predetermined compound or material, and deposited onto a substrate within the processing chamber. There are several CVD processes. One CVD process is plasma enhanced chemical vapor deposition (PECVD) whereby a plasma is ignited in the chamber to enhance the reaction between the precursors. PECVD may be accomplished by utilizing an inductively coupled plasma source or a capacitively coupled plasma source.

The CVD process may be used to process large area substrates, such as flat panel displays or solar panels. CVD may be used to deposit layers such as silicon based films for transistors. There is a need in the art for a method and apparatus that reduces the cost of manufacturing flat panel display devices.

SUMMARY OF THE INVENTION

The present invention generally relates to a vertical CVD system having a processing chamber that is capable of processing multiple substrates. The multiple substrates are disposed on opposite sides of the processing source within the processing chamber, yet the processing environments are not isolated from each other. The processing source is a horizontally centered vertical plasma generator that permits multiple substrates to be processed simultaneously on either side of the plasma generator, yet independent of each other. The system is arranged as a twin system whereby two identical processing lines, each with their own processing chamber, are arranged adjacent to each other. Multiple robots are used to load and unload the substrates from the processing system. Each robot can access both processing lines within the system.

In one embodiment, an apparatus includes a chamber body, a plurality of plasma generators, a first waveguide coupled to the first end of each plasma generator, a second waveguide coupled to the second end of each plasma generator, a first power source coupled to the first waveguide, the first power source disposed outside of the chamber body, and a second power source coupled to the second waveguide. The plurality of plasma generators are horizontally centered within the chamber body and extend vertically within the chamber body such that sufficient space remains within the chamber body for one or more substrates to be processed on opposite sides of the plurality of plasma generators. Each plasma generator has a first end adjacent a bottom of the chamber body and a second end adjacent a top of the chamber body. The second power sources are disposed outside of the chamber body. The second power sources are collectively arranged in a staggered pattern such that adjacent second waveguides extend in opposite directions from the plasma generators to corresponding second power sources.

In another embodiment, an apparatus includes a chamber body, a plurality of plasma generators, a first waveguide coupled to the first end of each plasma generator, a second waveguide coupled to the second end of each plasma generator, a first power source coupled to the first waveguide, the first power source disposed outside of the chamber body, and a second power source coupled to the second waveguide. The plurality of plasma generators are horizontally centered within the chamber body and extend vertically within the chamber body such that sufficient space remains within the chamber body for one or more substrates to be processed on opposite sides of the plurality of plasma generators. Each plasma generator has a first end adjacent a bottom of the chamber body and a second end adjacent a top of the chamber body. The second power sources are disposed outside of the chamber body. The second power sources are collectively arranged in a pattern such that adjacent second waveguides extend in the same direction from the plasma generators to corresponding second power sources.

In another embodiment, an apparatus includes a chamber body, a plurality of plasma generators, a first angled waveguide coupled to the first end of each plasma generator, a second angled waveguide coupled to the second end of each plasma generator, a first power source coupled to the first waveguide, the first power source disposed outside of the chamber body, and a second power source coupled to the second waveguide. The plurality of plasma generators are horizontally centered within the chamber body and extend vertically within the chamber body such that sufficient space remains within the chamber body for one or more substrates to be processed on opposite sides of the plurality of plasma generators. Each plasma generator has a first end adjacent a bottom of the chamber body and a second end adjacent a top of the chamber body. The second power sources are disposed outside of the chamber body. The second power sources are collectively arranged in a staggered pattern such that each second waveguide extends up along a side of the chamber body and along a roof of the chamber body to the first end of each plasma generator.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 13A and 13B are schematic representations of a processing chamber according to another embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to a vertical CVD system having a processing chamber that is capable of processing multiple substrates. The multiple substrates are disposed on opposite sides of the processing source within the processing chamber, yet the processing environments are not isolated from each other. The processing source is a horizontally centered vertical plasma generator that permits multiple substrates to be processed simultaneously on either side of the plasma generator, yet independent of each other. The system is arranged as a twin system whereby two identical processing lines, each with their own processing chamber, are arranged adjacent to each other. Multiple robots are used to load and unload the substrates from the processing system. Each robot can access both processing lines within the system.

A horizontally centered vertical plasma generator is a plasma generator that has a plasma source that is vertical within the processing chamber. By vertical it is understood that the plasma source extends from a first end near or at the bottom of the chamber to a second end at near or at the top of the chamber. By being horizontally centered it is understood that the plasma source is equally spaced between two walls or ends of the processing chamber.

The embodiments discussed herein may be practiced utilizing a vertical CVD chamber in a modified AKT Aristo system available from Applied Materials, Inc., Santa Clara, Calif. It is to be understood that the embodiments may be practiced in other systems as well, including those sold by other manufacturers.

Figure 1:
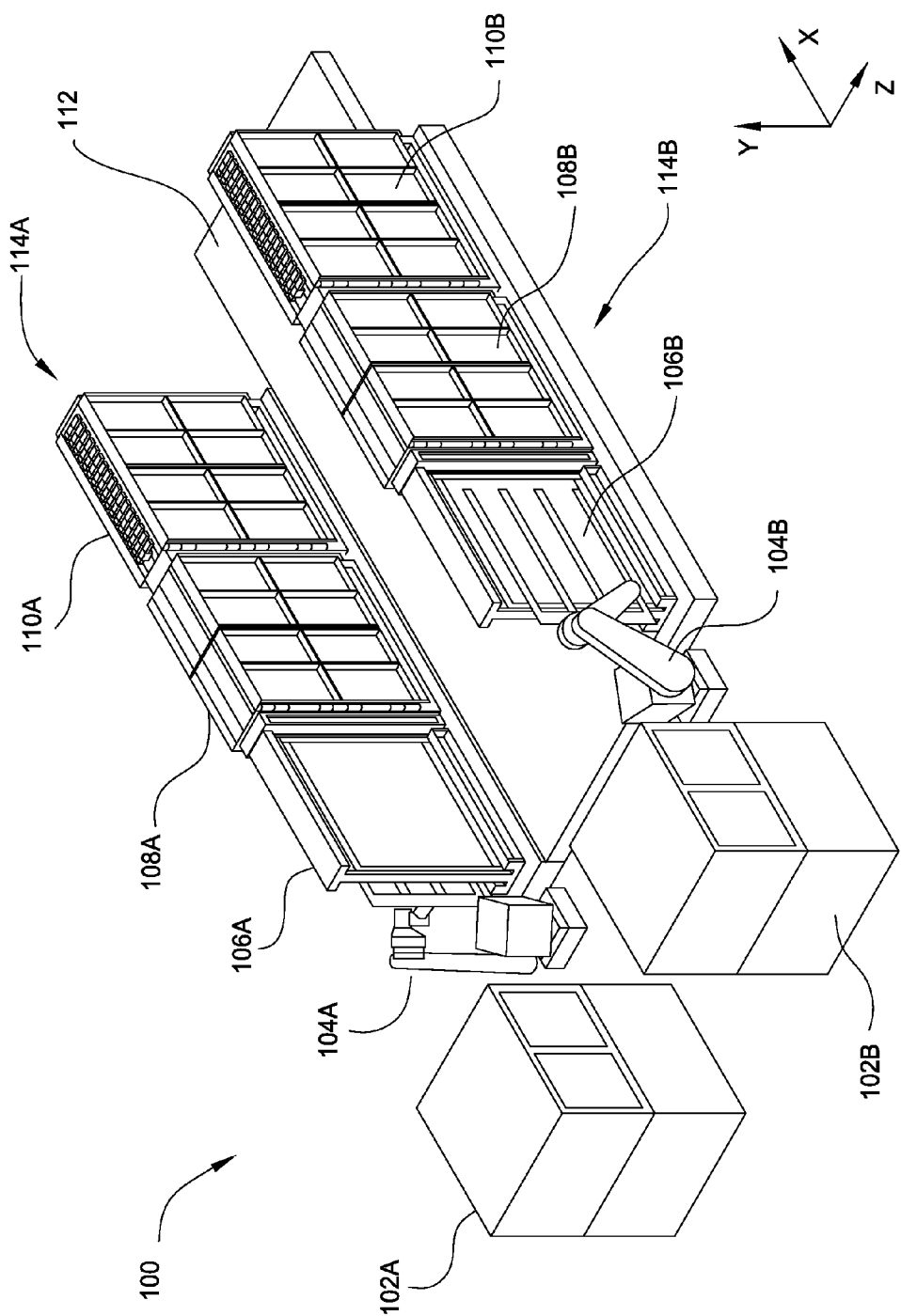
FIG. 1 is a schematic representation of a processing system according to one embodiment.

FIG. 1 is a schematic representation of a vertical, linear CVD system 100 according to one embodiment. The system 100 may be sized to process substrates having a surface area of greater than about 90,000 mm$^2$ and able to process more than 90 substrates per hour when depositing a 2,000 Angstrom thick silicon nitride film. The system 100 preferably includes two separate process lines 114A, 114B coupled together by a common system control platform 112 to form a twin process line configuration/layout. A common power supply (such as an AC power supply), common and/or shared pumping and exhaust components and a common gas panel may be used for the twin process lines 114A, 114B. Each process line 114A, 114B may process more than 45 substrates per hour for a system total of greater than 90 substrates per hour. It is also contemplated that the system may be configured using a single process line or more than two process lines.

There are several benefits to the twin processing lines 114A, 114B for vertical substrate processing. Because the chambers are arranged vertically, the footprint of the system 100 is about the same as a single, conventional horizontal processing line. Thus, within approximately the same footprint, two processing lines 114A, 114B are present, which is beneficial to the manufacturer in conserving floor space in the fab. To help understand the meaning of the term "vertical", consider a flat panel display. The flat panel display, such as a computer monitor, has a length, a width and a thickness. When the flat panel display is vertical, either the length or width extends perpendicular from the ground plane while the thickness is parallel to the ground plane. Conversely, when a flat panel display is horizontal, both the length and width are parallel to the ground plane while the thickness is perpendicular to the ground plane. For large area substrates, the length and width are many times greater than the thickness of the substrate.

Each processing line 114A, 114B includes a substrate stacking module 102A, 102B from which fresh substrates (i.e., substrates which have not yet been processed within the system 100) are retrieved and processed substrates are stored. Atmospheric robots 104A, 104B retrieve substrates from the substrate stacking modules 102A, 102B and place the substrates into a dual substrate loading station 106A, 106B. It is to be understood that while the substrate stacking module 102A, 102B is shown having substrates stacked in a horizontal orientation, substrates disposed in the substrate stacking module 102A, 102B may be maintained in a vertical orientation similar to how the substrates are held in the dual substrate loading station 106A, 106B. The fresh substrates are then moved into dual substrate load lock chambers 108A, 108B and then to a dual substrate processing chamber 1010A, 1010B. The substrate, now processed, then returns through one of the dual substrate load lock chambers 108A, 108B to one of the dual substrate loading stations 106A, 106B, where it is retrieved by one of the atmospheric robot 104A, 104B and returned to one of the substrate stacking modules 102A, 102B.

Figure 2:
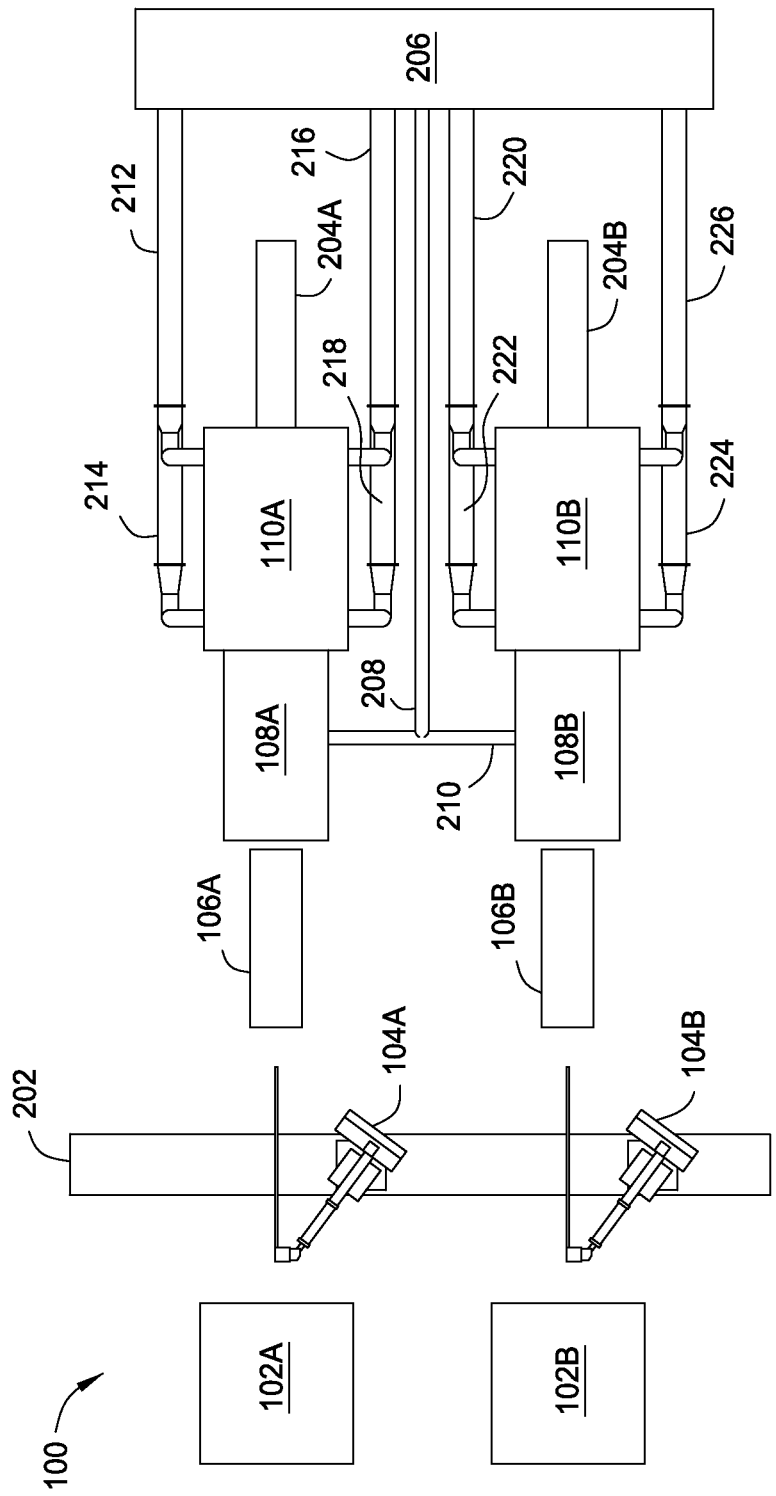
FIG. 2 is a schematic top view of the processing system of FIG. 1.

FIG. 2 is a plan view of the embodiment of FIG. 1. The sequence will be discussed in reference to both processing lines 114A, 114B at the same time even though a substrate goes down only one path. Each robot 104A, 104B may move along a common track 202. As will be discussed below, each robot 104A, 104B may access both substrate loading stations 106A, 106B. Occasionally, the substrate carrier that is used to transport the substrates through the processing lines 114A, 114B will need to be serviced for purposes of repair, cleaning, or replacement. Thus, substrate carrier service stations 204A, 204B are coupled to the processing chambers 110A, 110B along the processing lines 114A, 114B opposite the load lock chambers 108A, 108B.

To evacuate the load lock chambers 108A, 108B as well as the processing chambers 110A, 110B, one or more vacuum pumps 206 may be coupled thereto. To evacuate the load lock chambers 108A, 108B, the vacuum pump 206 draws the vacuum from an evacuation line 210 that is coupled to both load lock chambers 106A, 106B. To evacuate the processing chambers 110A, 110B, evacuation lines 212, 214, 216, 218, 220, 222, 224, 226 are coupled to the processing chambers 110A, 110B. The evacuation of the load lock chambers 108A, 108B and processing chambers 110A, 110B will be discussed further below with reference to FIG. 7.

Figure 3:
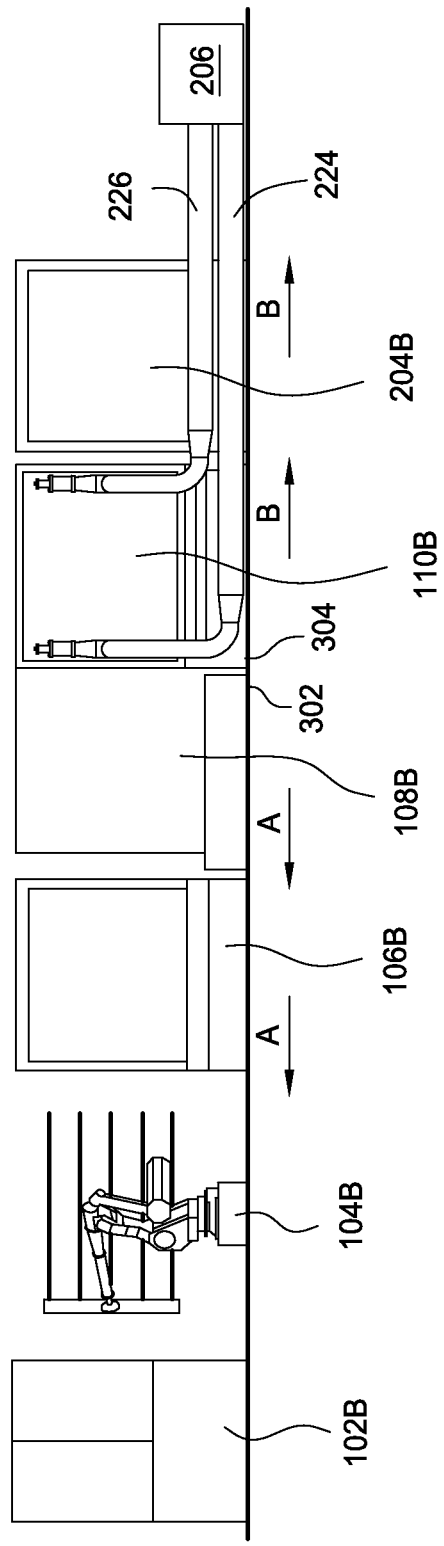
FIG. 3 is a schematic side view of the processing system of FIG. 1.

FIG. 3 is a side view of the system 100. During operation, the processing chambers 110A, 110B may raise in temperature and thus be subject to thermal expansion. Similarly, substrates with elevated temperatures may enter the load lock chambers 108A, 108B from the processing chambers 110A, 110B which may cause the load lock chambers 108A, 108B to experience thermal expansion. To compensate for the thermal expansion of the load lock chambers 108A, 108B, the load lock chambers 108A, 108B may have the end 302 that is adjacent the processing chambers 110A, 110B fixed yet permit the remainder of the load lock chamber 108A, 108B, as well as the adjacent substrate loading station 106A, 106B to move in the direction shown by arrow "A". Similarly, the processing chambers 110A, 110B may have an end 304 fixed adjacent the load lock chambers 108A, 108B while the other end of the processing chamber 110A, 110B as well as the substrate carrier service stations 204A, 204B may move in the direction shown by arrow "B" by thermal expansion. As the processing chambers 110A, 110B expand due to thermal expansion, the substrate carrier service stations 204A, 204B also move to permit the processing chambers 110A, 110B to expand. If the substrate carrier service stations 110A, 110B did not move as the processing chambers 110A, 110B expanded, the processing lines 114A, 114B could buckle much like a railroad track on a hot summer day. Similarly, as the load lock chambers 108A, 108B expand, the substrate loading stations 106A, 106B also move to permit the load lock chambers 108A, 108B to expand.

Figure 4:
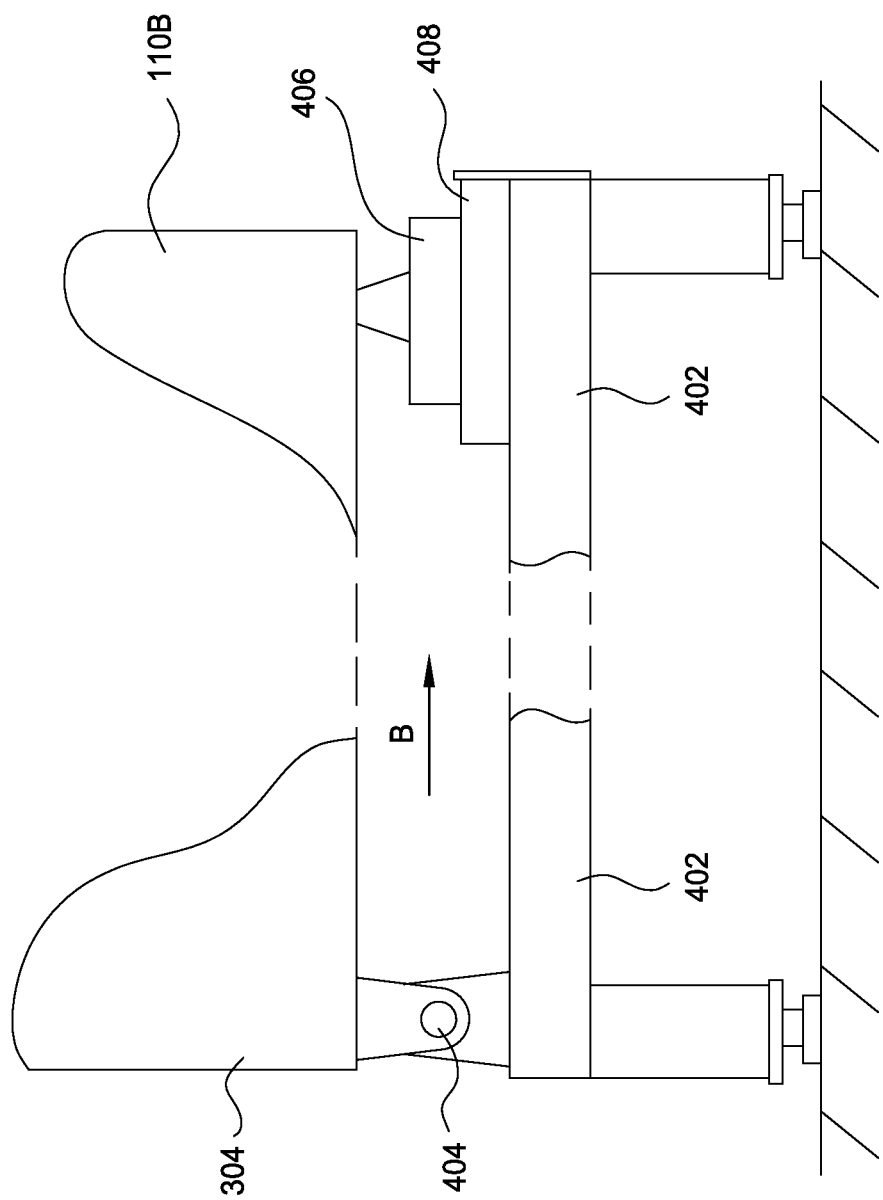
FIG. 4 is a close-up view of the processing chamber of FIG. 1.

FIG. 4 is a close-up view of the processing chamber 110B showing the equipment that permits the processing chamber 110B to move due to thermal expansion. It is to be understood that while the description will be made with reference to the processing chamber 110B, the description will be equally applicable to the load lock chamber 108B. The processing chamber 110B is disposed over a frame 402. The end 304 of the processing chamber 110B has a fixed point 404 and a foot portion 406 that may move along a piece of low friction material 408 that is disposed on the frame 402. Suitable material that may be used for the low friction material 408 includes polytetrafluoroethylene. It is to be understood that other low friction materials are also contemplated. It is to be understood that both the substrate carrier service stations 204A, 204B as well as the substrate loading stations 106A, 106B will have foot portions disposed over a frame having low friction material to permit the substrate carrier service stations 204A, 204B and the substrate loading stations 106A, 106B to move.

Figure 5:
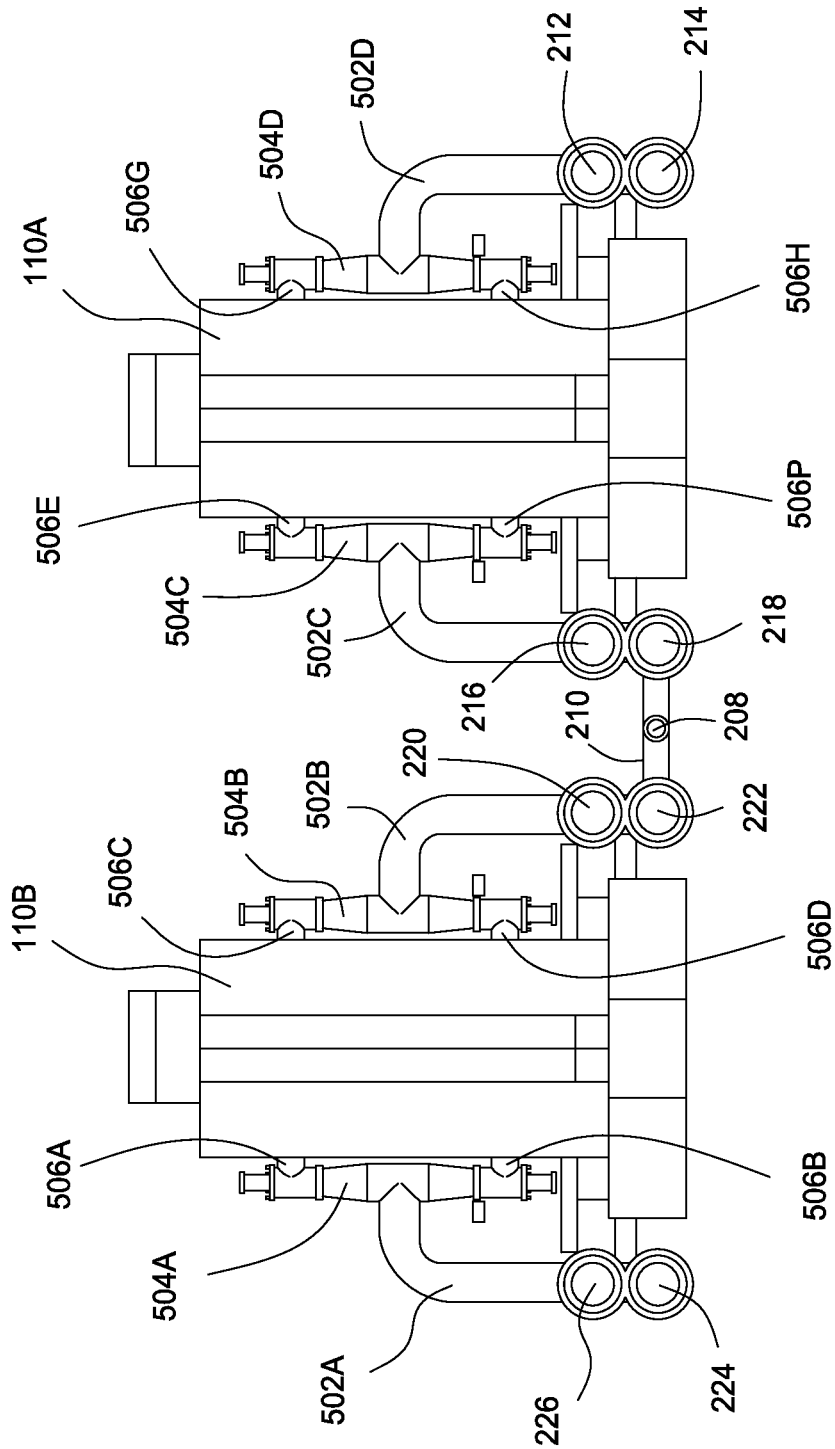
FIG. 5 is a schematic back view of the processing system of FIG. 1.
Figure 6B:
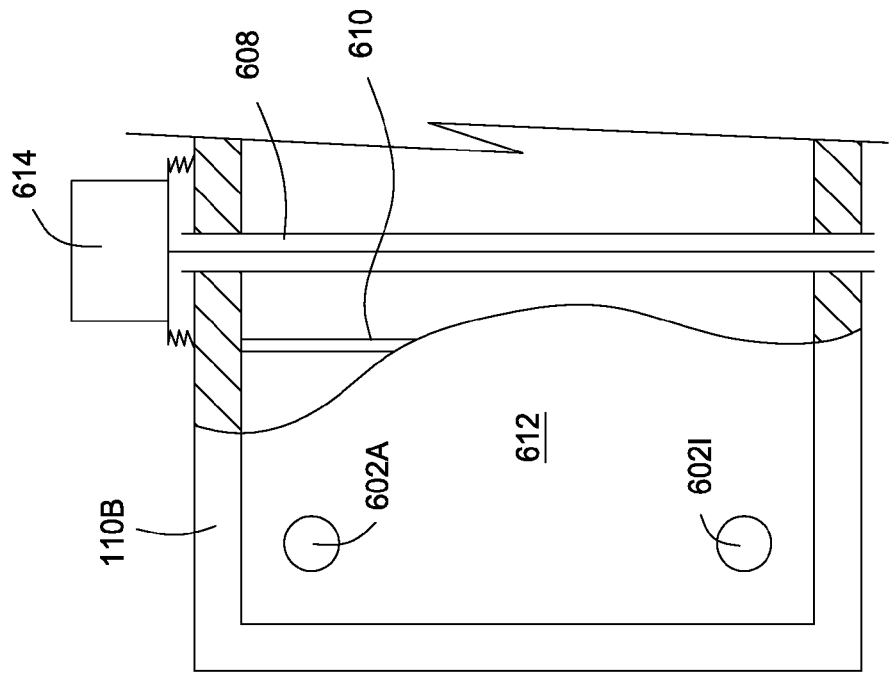
FIG. 6B is a partial side view of the processing chamber of FIG. 1.
Figure 6A:
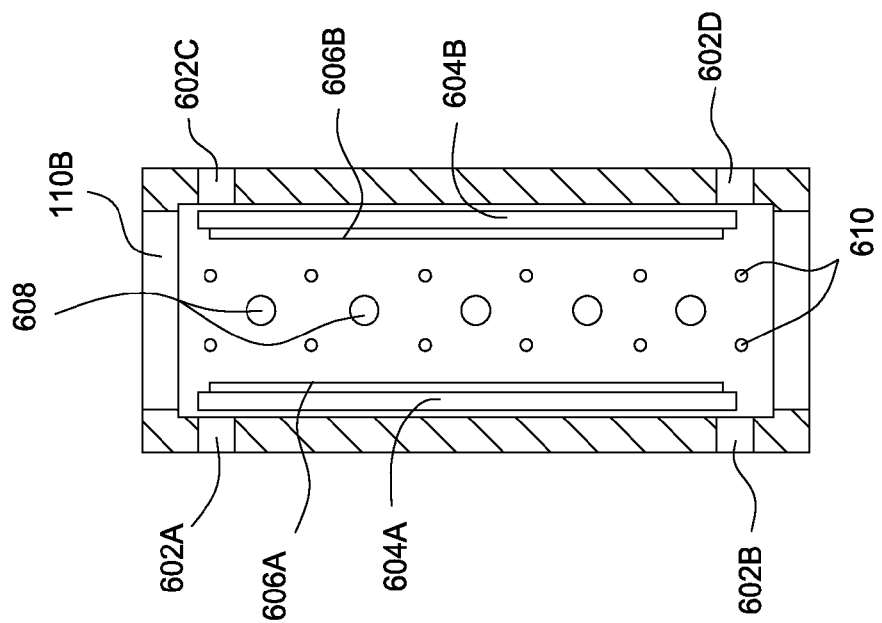
FIG. 6A is a schematic cross-sectional view of the processing chamber of FIG. 1.

FIG. 5 is a back elevation view of the processing system 100 showing the evacuation system. FIGS. 6A and 6B are top and partial side views of the processing chamber 110B showing the evacuation locations for connecting the vacuum system thereto. The evacuation lines 212, 214, 216, 218, 220, 222, 224, 226 each have a vertical conduit 502A-502D that then couples to a splitter conduit 504A-504D. Each splitter conduit 504A-504D has two connection points 506A-506H that couple to the processing chamber 110A, 110B. Thus, there are four connection points for each side of each processing chamber 110A, 110B.

FIG. 6A shows the connection points 602A-602D for processing chamber 110B. The processing chamber 110B is shown to have two substrate carriers 604A, 604B, each having a substrate 606A, 606B thereon. Plasma generators 608 are centrally located as are the gas introduction conduit 610. The plasma generators 608 are microwave sources that generate a plasma within the processing chambers 110A, 110B for CVD. The plasma generators 608 are powered by power sources 614. As shown in FIG. 6B, the connection points 602A, 6021 are disposed near the corners of the chamber lid 612. Because the connection points 602A-602D are disposed near the corners of the processing chamber 110B, the processing chamber 110B may be evacuated substantially uniformly in all areas of the chamber 110B. If only one evacuation point were utilized, there may be greater vacuum near the evacuation point as compared to a location further away. It is contemplated that other evacuation connections are possible, including additional connections.

Figure 7:
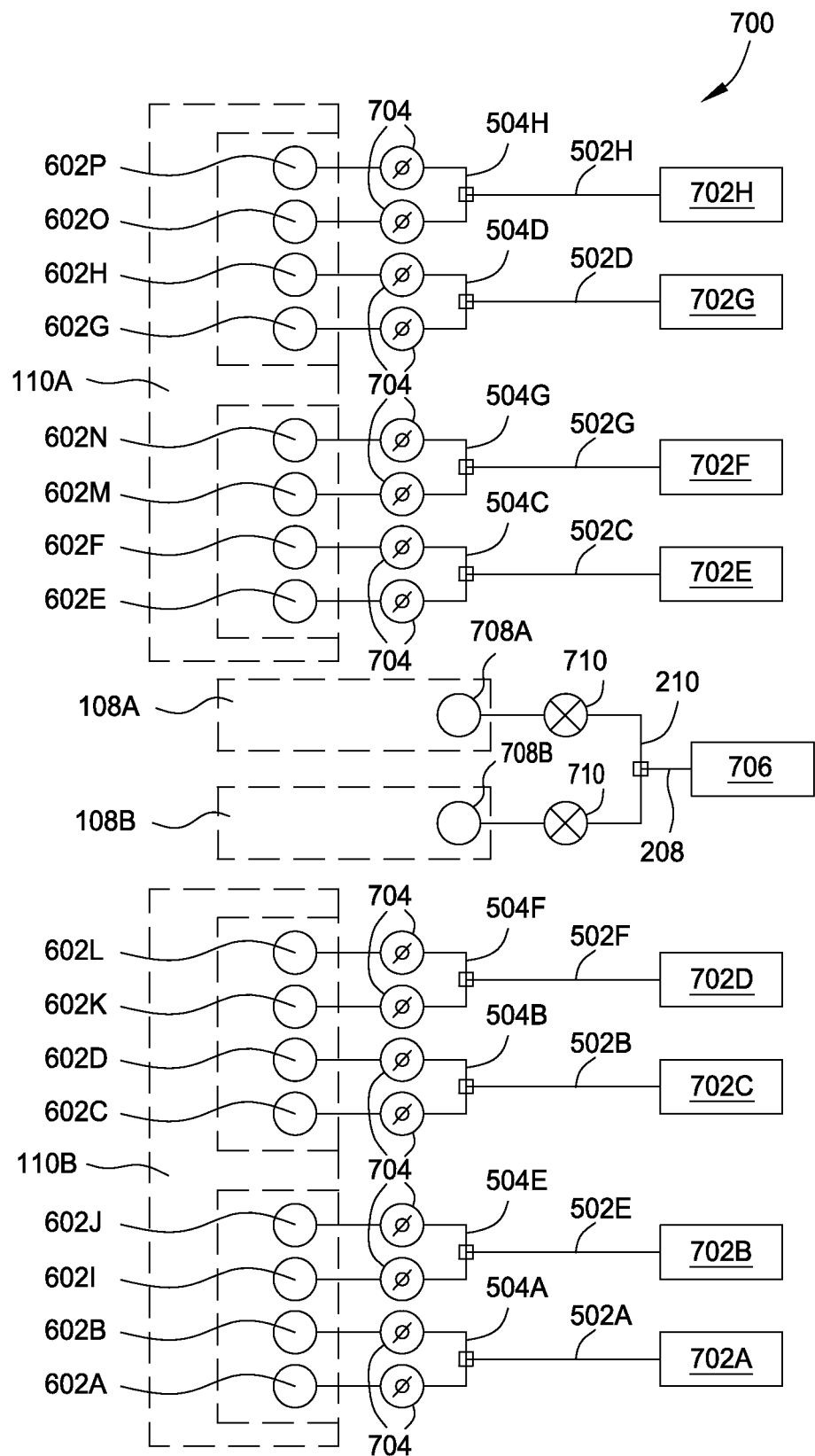
FIG. 7 is a schematic illustration of an evacuation system for the processing system of FIG. 1.

FIG. 7 is a schematic illustration of the evacuation system 700 according to one embodiment. Rather than a single vacuum pump, each processing chamber 110A, 110B may have several vacuum pumps 702A-702H. Each vertical line 502A-502H splits into the splitter conduits 504A-504H before coupling to the connection points 602A-602P. A throttle valve 704 may be positioned between the connection points 602A-602P and the splitter conduits 504A-504H to control the vacuum level for the respective processing chambers 110A, 110B. It is to be understood that the evacuation system 700 is applicable to a system with fewer vacuum pumps. If one of the vacuum pumps coupled to a processing chamber does not function, it is possible for the other vacuum pumps coupled to the processing chamber to compensate for the non-functioning pump so that the processing chamber may maintain a predetermined vacuum level.

The load lock chambers 108A, 108B may be evacuated by a common vacuum pump 706 coupled to the connection points 708A, 708B of the load lock chambers 108A, 108B. A two way valve 710 may be present between the vacuum pump 706 and the connection points 708A, 708B to control the vacuum level of the load lock chambers 108A, 108B.

Figure 8:
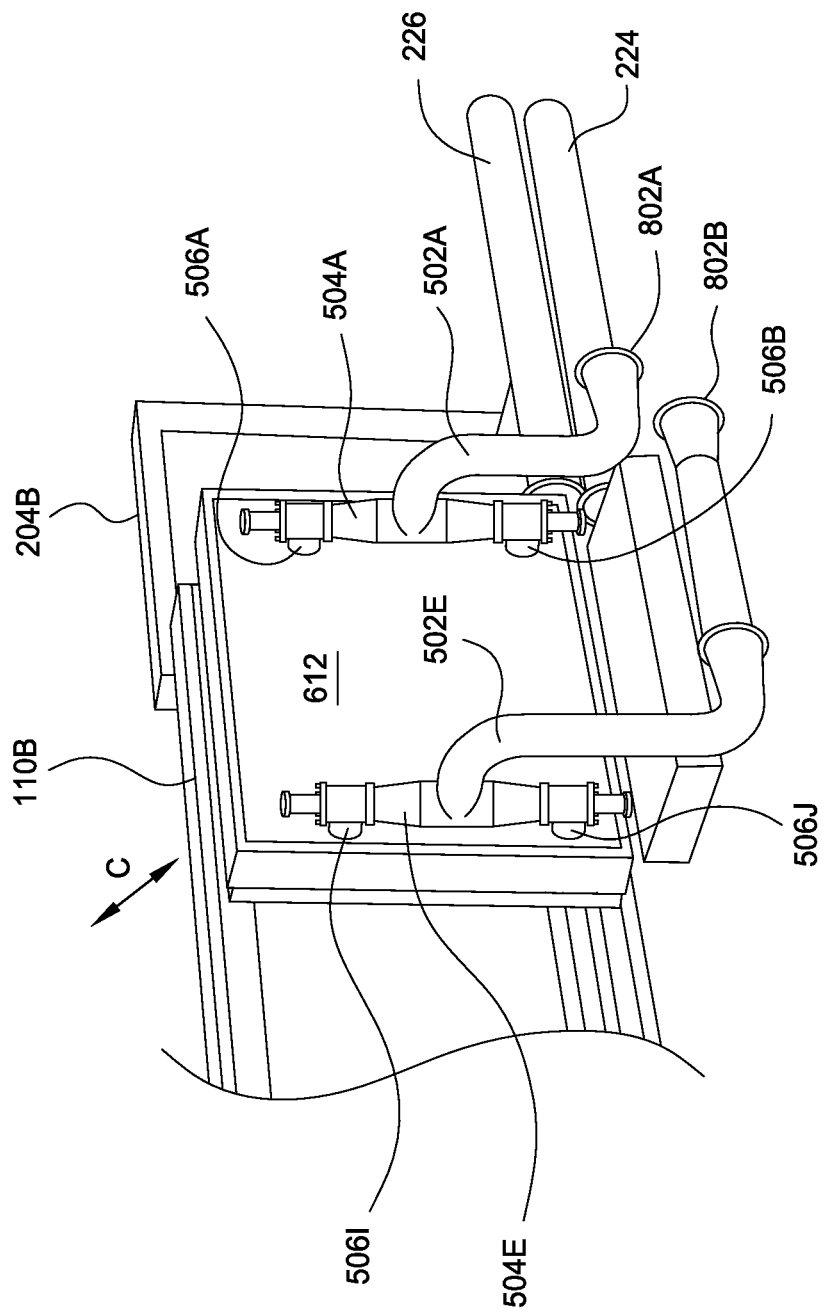
FIG. 8 is an isometric view of the processing chamber of FIG. 1.

FIG. 8 is a side perspective view of a chamber lid 612 spaced from the processing chamber 110B. In order to service the processing chamber 110B, the lid 612 may be moved as shown by arrows "C" by disconnecting the vertical conduits 502A, 502E from the evacuation lines 224, 226 at points 802A, 802B. Thus, the lid 612 may be moved without having to disassemble the entire evacuation system 700 or moving numerous, heavy system components. The lid 612 may be moved by sliding the lid 612 away from the processing chamber 110B using a movement device such as a crane or hydraulic lifts.

Figure 9:
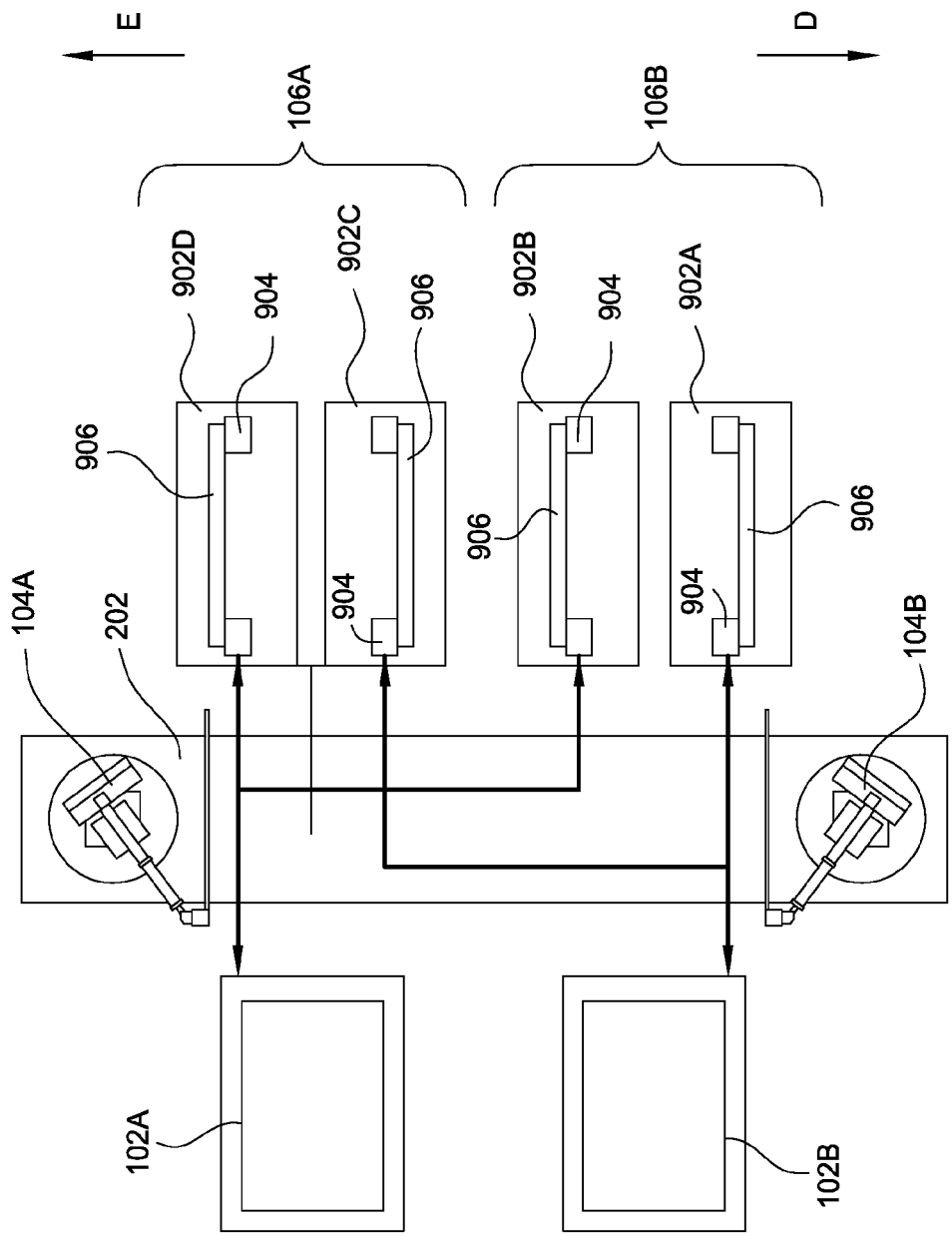
FIG. 9 is a schematic top illustration of the substrate sequencing for the processing system of FIG. 1.

FIG. 9 illustrates the sequence for the robots 104A, 104B removing substrates 906 from the substrate stacking modules 102A, 102B and placing the substrates 906 into the substrate loading station environments 902A-902D. The substrate loading stations 106A, 106B are shown to have two separate environments 902A-902D. In each environment, the substrate carrier 906 faces a different direction. Thus, when the substrates 906 are disposed within the substrate loading station environments 902A-902D, the substrates 906 are spaced apart by the carriers 904 within each separate substrate loading station 106A, 106B.

Robot 104A retrieves a substrate 906 from the substrate stacking module 102A and moves along the track 202 to place the substrate 906 in either environment 902B or 902D. When the robot 104A places the substrate 906 in an environment 902B, 902D, the substrate 906 is placed on a carrier 904 such that the substrate 906 faces the direction of arrow "E" away from the carrier 904. Similarly, robot 104B retrieves a substrate 906 from the substrate stacking module 102B and moves along the track 202 to place the substrate 906 in either environment 902A, 902C. When the robot 104B places the substrate 906 in an environment 902A, 902C, the substrate 906 is placed on a carrier 904 such that the substrate 906 faces in the direction of arrow "D" away from the carrier 904. Thus, both robots 104A, 104B can access the same substrate loading station 106A, 106B and move along the same track 202. However, each robot 104A, 104B accesses a separate environment 902A-902D of the substrate loading stations 106A, 106B and can only place the substrates 906 on respective carriers 904 facing a specific direction.

Figure 10B:
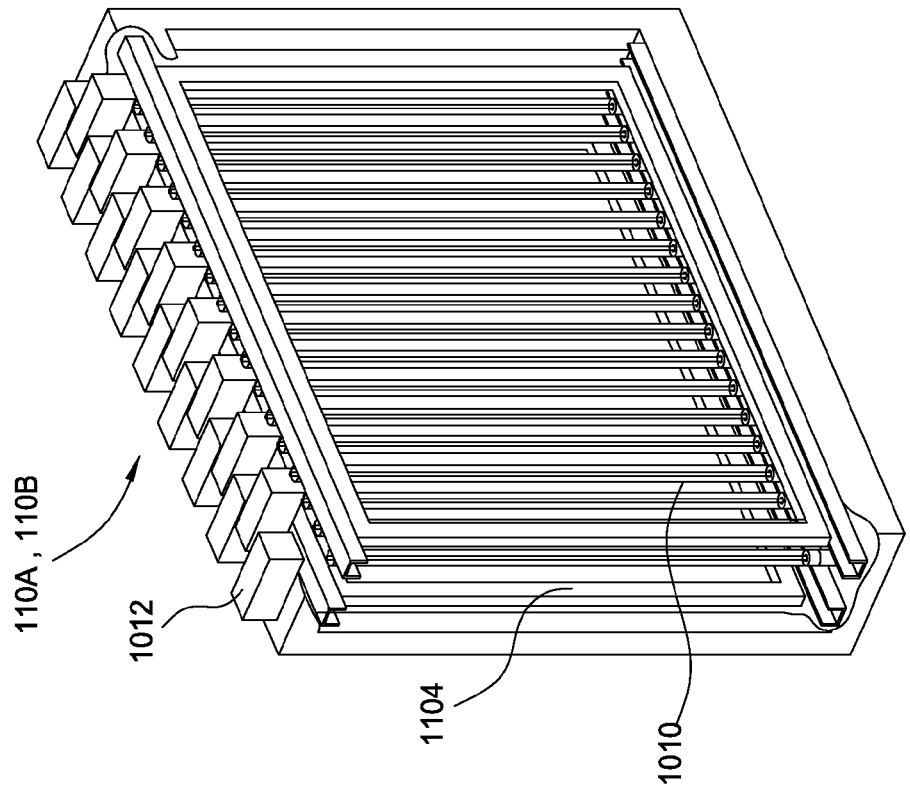
FIGS. 10A-10C are schematic representations of the processing chambers of FIG. 1.
Figure 10A:
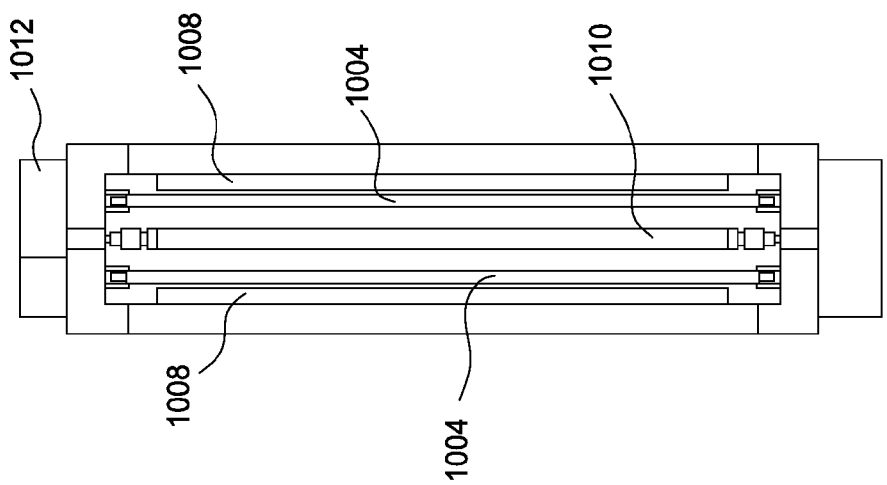
Figure 10C:
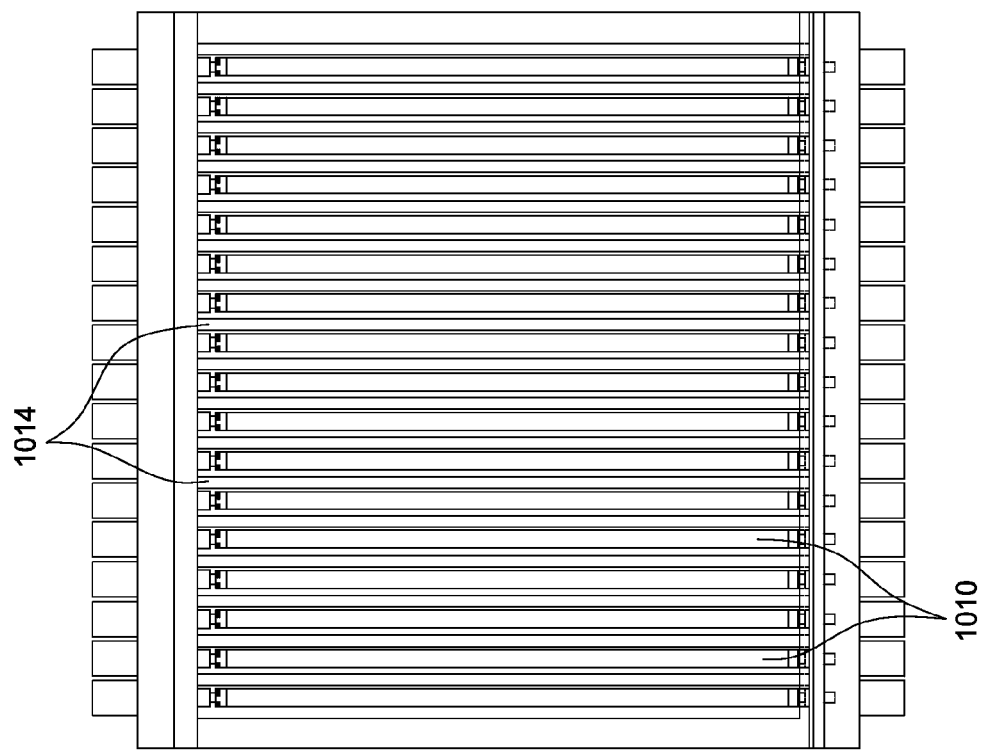

FIGS. 10A-10C are schematic representations of the dual processing chambers 110A, 110B according to one embodiment. The dual processing chambers 110A, 110B include a plurality of microwave antennas 1010 disposed in a linear arrangement in the center of each processing chamber 110A, 110B. The antennas 1010 extend vertically from a top of the processing chamber to a bottom of the processing chamber. Each microwave antenna 1010 has a corresponding microwave power head 1012 at both the top and the bottom of the processing chamber that is coupled to the microwave antenna 1010. As shown in FIG. 10B, the microwave power heads 1012 are staggered. The staggering may be due to space limitations. Power may be independently applied to the each end of the antenna 1010 through each power head 1012. The microwave antennas 1010 may operate at a frequency within a range of 300 MHz and 300 GHz.

Each of the processing chambers are arranged to be able to process two substrates, one on each side of the microwave antennas 1010. The substrates are held in place within the processing chamber by a platen 1008 and a shadow frame 1004. Gas introduction tubes may 1014 are disposed between adjacent microwave antennas 1010. The gas introduction tubes 1014 extend vertically from the bottom to the top of the processing chamber parallel to the microwave antennas 1010. The gas introduction tubes 1014 permit the introduction of processing gases, such as silicon precursors and nitrogen precursors. While not shown in FIGS. 10A-10C, the processing chambers 110A, 110B may be evacuated through a pumping port located behind the substrate carriers 1008.

Figure 11B:
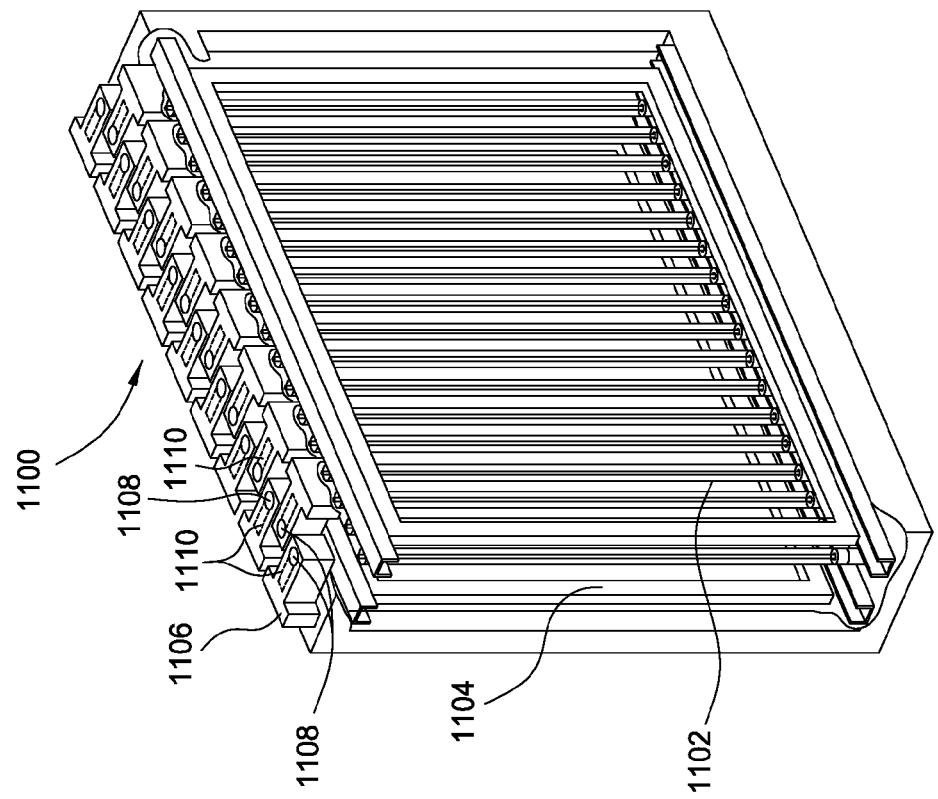
FIGS. 11A and 11B are schematic representations of a processing chamber according to another embodiment.
Figure 11A:
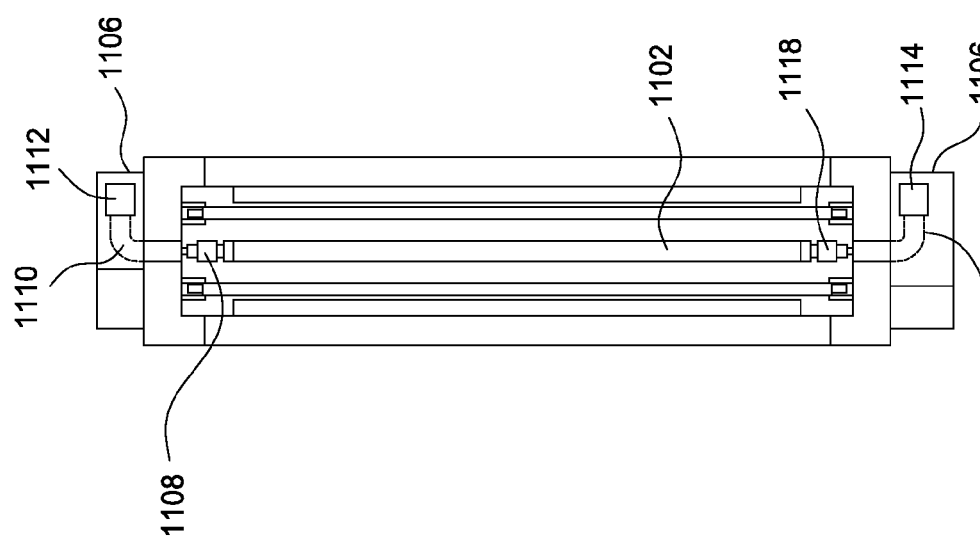

FIGS. 11A and 11B are schematic representations of a processing chamber 1100 according to another embodiment. The processing chamber 1100 includes a plurality of plasma generators, such as microwave antennas, that extend vertically within the chamber body from a first end 1108 to a second end 1118. The processing chamber 1100 includes a shadow frame 1104 on each side of the plasma generators 1102 for use in processing substrates. As shown in FIG. 11B, a shadow frame 1104 is disposed on opposite sides of the plurality of plasma generators 1102 so that there are two large area substrates may be processed within a single processing chamber 1100 and thus be exposed to the same processing environment either simultaneously or consecutively.

Each plasma generator 1102 is coupled to a first waveguide 1110 at the first end 1108 thereof and to a second waveguide 1116 at the second end 1118 thereof. Each first waveguide 1110 is coupled to a first power source 1112 while each second waveguide is coupled to a second power source 1114. The power sources 1112, 1114 may be coupled to the waveguides 1110, 1116 within an enclosure 1106. As best seen in FIG. 11B, the enclosures 1106 are staggered "T" shaped enclosures. The staggered "T" shaped enclosures may be necessary due to space limitations. In such an arrangement, adjacent waveguides 1110, 1116 extend in opposite, parallel directions from the ends 1108, 1118 to the respective power sources 1112, 1114. Gas introduction tubes may also be disposed within the processing chamber 1100 in the manner discussed above with regard to FIG. 10C.

Figure 12B:
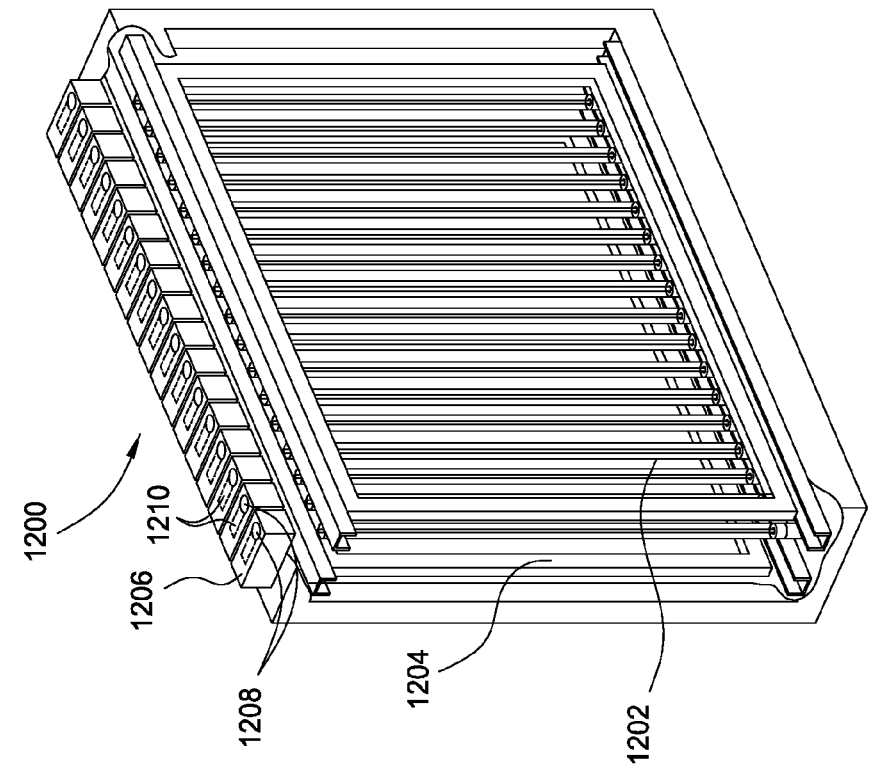
FIGS. 12A and 12B are schematic representations of a processing chamber according to another embodiment.
Figure 12A:
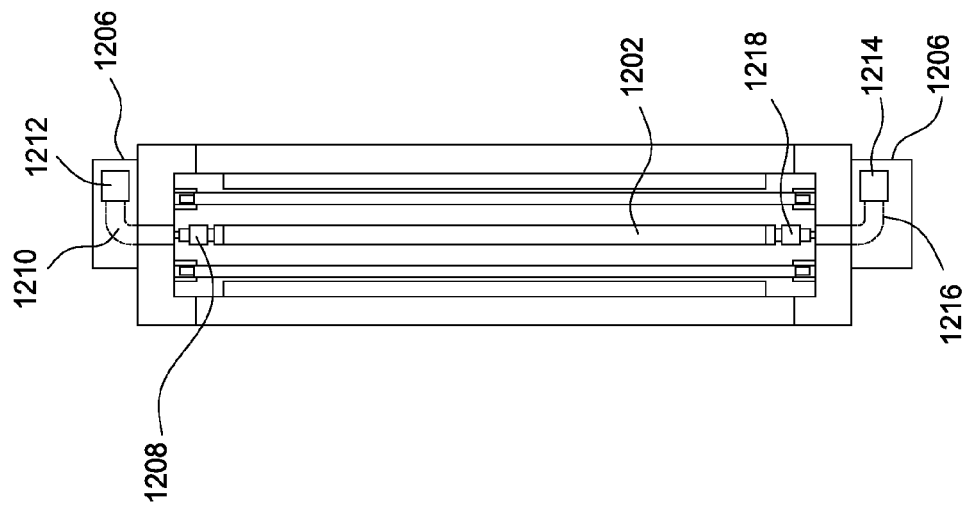

FIGS. 12A and 12B are schematic representations of a processing chamber 1200 according to another embodiment. The processing chamber 1200 includes a plurality of plasma generators, such as microwave antennas, that extend vertically within the chamber body from a first end 1208 to a second end 1218. The processing chamber 1200 includes a shadow frame 1204 on each side of the plasma generators 1202 for use in processing substrates. As shown in FIG. 12B, a shadow frame 1204 is disposed on opposite sides of the plurality of plasma generators 1202 so that there are two large area substrates may be processed within a single processing chamber 1200 and thus be exposed to the same processing environment either simultaneously or consecutively.

Each plasma generator 1202 is coupled to a first waveguide 1210 at the first end 1208 thereof and to a second waveguide 1216 at the second end 1218 thereof. Each first waveguide 1210 is coupled to a first power source 1212 while each second waveguide is coupled to a second power source 1214. The power sources 1212, 1214 may be coupled to the waveguides 1210, 1216 within an enclosure 1206. As best seen in FIG. 12B, the enclosures 1206 all extend from the same side of the processing chamber 1200. In such an arrangement, adjacent waveguides 1210, 1216 extend in the same, parallel direction from the ends 1208, 1218 to the respective power sources 1212, 1214. Gas introduction tubes may also be disposed within the processing chamber 1200 in the manner discussed above with regard to FIG. 10C.

FIGS. 13A and 13B are schematic representations of a processing chamber 1300 according to another embodiment. The processing chamber 1300 includes a plurality of plasma generators, such as microwave antennas, that extend vertically within the chamber body from a first end 1308 to a second end 1318. The processing chamber 1300 includes a shadow frame 1304 on each side of the plasma generators 1302 for use in processing substrates. As shown in FIG. 13B, a shadow frame 1304 is disposed on opposite sides of the plurality of plasma generators 1302 so that there are two large area substrates may be processed within a single processing chamber 1300 and thus be exposed to the same processing environment either simultaneously or consecutively.

Each plasma generator 1302 is coupled to a first angled waveguide 1310 at the first end 1308 thereof and to a second angled waveguide 1316 at the second end 1318 thereof. Each first angled waveguide 1310 is coupled to a first power source 1312 while each second angled waveguide is coupled to a second power source 1314. Enclosures 1306 are shown on top and bottom of the chamber 1300 by have been removed from the side of the chamber for clarity in viewing the waveguides 1310, 1316. As best seen in FIG. 13B, the waveguides 1310, 1316 extend along the top of the processing chamber 1300 and down along the side of the processing chamber 1300 to the respective power sources 1312, 1314. Due to the location of the power sources 1312, 1314 relative to the first and second ends 1308, 1318 of the plasma generators 1302, the waveguides 1310, 1316 are angled. Gas introduction tubes may also be disposed within the processing chamber 1300 in the manner discussed above with regard to FIG. 10C.

By utilizing a vertical CVD system, multiple substrates may be processed simultaneously. Processing multiple substrates simultaneously reduces the cost of manufacturing which may increase the manufacturer's profits.

While the foregoing is directed to embodiments of the present invention, other and further embodiments of the invention may be devised without departing from the basic scope thereof, and the scope thereof is determined by the claims that follow.

The invention claimed is:
1. An apparatus, comprising:
a chamber body that includes one or more removable lids, each lid forming a respective sidewall of the chamber body and including a plurality of openings for evacuating the chamber body using one or more evacuation lines;

a plurality of plasma generators, horizontally centered within the chamber body and extending vertically within the chamber body such that sufficient space remains within the chamber body for one or more substrates to be processed on opposite sides of the plurality of plasma generators, each plasma generator having a first end adjacent a bottom of the chamber body and a second end adjacent a top of the chamber body;

a first waveguide coupled to the first end of each plasma generator;

a second waveguide coupled to the second end of each plasma generator;

a first power source coupled to each first waveguide, the first power source disposed outside of the chamber body;

a second power source coupled to each second waveguide, the second power source disposed outside of the chamber body, the second power sources being collectively arranged in a pattern such that adjacent second waveguides extend in a common direction from the plasma generators to corresponding second power sources; and one or more vertical conduits coupled to the plurality of openings and configured to disconnect from the one or more evacuation lines when removing the one or more removable lids.

2. The apparatus of claim 1, wherein the plurality of plasma generators are microwave generators.

3. The apparatus of claim 2, further comprising a plurality of gas introduction tubes disposed within the chamber body and adjacent the plurality of microwave generators.

4. The apparatus of claim 3, wherein the one or more lids that are removable to access the plurality of microwave generators located inside the chamber body.

5. The apparatus of claim 4, further comprising one or more vacuum pumps coupled with the chamber body such that the chamber body may be evacuated through the plurality of openings extending through each lid.

6. The apparatus of claim 5, wherein the chamber body is disposed on a frame and wherein the chamber body has a first end fixed to the frame.

7. The apparatus of claim 6, further comprising a polytetrafluoroethylene element disposed on the frame, and wherein the chamber body has a second end disposed on the polytetrafluoroethylene element and is movable along the polytetrafluoroethylene element.

8. The apparatus of claim 1, wherein the chamber body further includes a port for transferring a substrate into the chamber body, wherein the port is located on a sidewall of the chamber body other than a sidewall including one of the one or more removable lids.

9. An apparatus, comprising:
a chamber body that includes one or more removable lids, each lid forming a respective sidewall of the chamber body and including a plurality of openings for evacuating the chamber body using one or more evacuation lines;

a plurality of plasma generators, horizontally centered within the chamber body and extending vertically within the chamber body such that sufficient space remains within the chamber body for one or more substrates to be processed on opposite sides of the plurality of plasma generators, each plasma generator having a first end adjacent a bottom of the chamber body and a second end adjacent a top of the chamber body;

a plurality of gas introduction tubes disposed within the chamber body, and extending in a direction substantially parallel to a longitudinal surface of the one or more substrates;

a first waveguide coupled to the first end of each plasma generator;

a second waveguide coupled to the second end of each plasma generator;

a first power source coupled to each first waveguide, the first power source disposed outside of the chamber body;

a second power source coupled to each second waveguide, the second power source disposed outside of the chamber body, the second power sources being collectively arranged in a pattern such that adjacent second waveguides extend in the same direction from the plasma generators to corresponding second power sources; and one or more vertical conduits coupled to the plurality of openings and configured to disconnect from the one or more evacuation lines when removing the one or more removable lids.

10. The apparatus of claim 9, wherein the plurality of gas introduction tubes extend vertically within the chamber body.

11. The apparatus of claim 9, wherein the plurality of gas introduction tubes are adjacent the plurality of plasma generators.

12. The apparatus of claim 9, wherein a horizontal position of each gas introduction tube is between the plasma generators and the space remaining within the chamber body for processing one of the one or more substrates.

13. The apparatus of claim 12, wherein the plurality of gas introduction tubes are arranged on the opposite sides of the plurality of plasma generators.

14. The apparatus of claim 13, wherein each of the opposite sides corresponds to a longitudinal surface of a respective substrate, and wherein gas introduction tubes on each of the opposite sides are evenly spaced along a direction of the longitudinal surface of the respective substrate.

15. An apparatus, comprising:
a chamber body that includes one or more removable lids, each lid forming a respective sidewall of the chamber body and including a plurality of openings for evacuating the chamber body using one or more evacuation lines;

a plurality of plasma generators, horizontally centered within the chamber body and extending vertically within the chamber body such that sufficient space remains within the chamber body for one or more substrates to be processed on each side of horizontally opposite sides of the plurality of plasma generators, each plasma generator having a first end adjacent a bottom of the chamber body and a second end adjacent a top of the chamber body;

a plurality of gas introduction tubes disposed within the chamber body and arranged to service each of the horizontally opposite sides;

a first waveguide coupled to the first end of each plasma generator;

a second waveguide coupled to the second end of each plasma generator;

a first power source coupled to each first waveguide, the first power source disposed outside of the chamber body;

a second power source coupled to each second waveguide, the second power source disposed outside of the chamber body, the second power sources being collectively arranged in a pattern such that adjacent second waveguides extend in the same direction from the plasma generators to corresponding second power sources; and one or more vertical conduits coupled to the plurality of openings and configured to disconnect from the one or more evacuation lines when removing the one or more removable lids.

16. The apparatus of claim 15, wherein the plurality of gas introduction tubes extend in a direction substantially parallel to a longitudinal surface of the one or more substrates.

17. The apparatus of claim 16, wherein the plurality of gas introduction tubes extend vertically within the chamber body.

18. The apparatus of claim 15, wherein the plurality of gas introduction tubes are adjacent the plurality of plasma generators.

19. The apparatus of claim 15, wherein a horizontal position of each gas introduction tube is between the plasma generators and the space remaining within the chamber body for processing one of the one or more substrates.

20. The apparatus of claim 19, wherein each of the horizontally opposite sides corresponds to a longitudinal surface of a respective substrate, and wherein gas introduction tubes on each of the horizontally opposite sides are evenly spaced along a direction of the longitudinal surface of the respective substrate.

* * * * *